United States Patent [19]

Allen

[11] Patent Number: 4,577,125
[45] Date of Patent: Mar. 18, 1986

[54] OUTPUT VOLTAGE DRIVER WITH TRANSIENT ACTIVE PULL-DOWN

[75] Inventor: Michael Allen, San Francisco, Calif.

[73] Assignee: Advanced Micro Devices, Inc., Sunnyvale, Calif.

[21] Appl. No.: 564,812

[22] Filed: Dec. 22, 1983

[51] Int. Cl.[4] .................... H03K 15/40; H03K 19/36
[52] U.S. Cl. .................................. 307/455; 307/270; 307/299 A; 307/255
[58] Field of Search ............... 307/455, 457, 475, 270, 307/299 A, 300, 255

[56] References Cited

U.S. PATENT DOCUMENTS

| | | | |
|---|---|---|---|
| 3,050,641 | 8/1962 | Walsh | 307/457 |
| 4,081,695 | 3/1978 | Allen et al. | 307/300 |
| 4,194,131 | 3/1980 | Mrazek et al. | 307/299 A |
| 4,287,435 | 9/1981 | Cavaliere et al. | 307/270 |
| 4,289,978 | 9/1981 | Konian et al. | 307/270 |

Primary Examiner—Stanley D. Miller
Assistant Examiner—B. P. Davis
Attorney, Agent, or Firm—Patrick T. King; Warren M. Becker; J. Vincent Tortolano

[57] ABSTRACT

An output voltage driver apparatus for an ECL circuit driving a capacitive load is disclosed which comprises an emitter follower means having an output emitter and a reference emitter. The output emitter is connected to the capacitive load. A pull-down transistor means is connected to the output emitter and provides a transient pull-down current for a capacitive load when the output voltage swings from a high level to a low level. A biasing means is connected between the reference emitter of the emitter follower means and the pull-down transistor means so that the pull-down transistor means is biased to turn on when the voltage at the output emitter is higher than the voltage at the reference emitter by a turn-on voltage. Because the capacitive load will hold the voltage of the output emitter higher than that of the reference emitter until the capacitance of the load is discharged, the pull-down transistor means provides a transient pull-down current which speeds up the switching time of the emitter couple logic circuit.

12 Claims, 4 Drawing Figures

OUTPUT VOLTAGE DRIVER WITH TRANSIENT ACTIVE PULL-DOWN

FIELD OF THE INVENTION

The present invention relates generally to output voltage drivers for logic circuits which drive capacitive loads and, more particularly, to output voltage drivers for providing transient active pull-down for emitter-coupled logic circuits driving a capacitive load.

BACKGROUND OF THE INVENTION

Emitter-coupled logic (ECL) is a desired technology for logic circuitry because its provides very fast switching times. Computers and other logic devices requiring very fast operation have been implemented using ECL.

Besides the high-speed switching available with ECL, the technology provides the further advantage of presenting to the designer a circuit which provides, for example, a logic OR output and a complementary logic NOR output. Thus the flexibility of designing with ECL is greater than other logic circuit technologies which do not provide the complementary outputs. Of course, ECL may likewise be configured to perform other logic functions as is known in the art.

Conventionally, the output voltage of an ECL circuit has been driven with an emitter follower transistor. The emitter follower transistor provides a low-impedance output which actively provides current to drive the output voltage from a low value to a high value. However, when the ECL output is to switch from a high value to a low value, the emitter follower output transistor would not provide a source to pull the output voltage down. Rather the voltage was left to passively drop.

If the output voltage of the ECL circuit drives a capacitive load, the switching time of the output during the swing from a high voltage to a low voltage would increase due to the capacitive load without an active pull-down current. Thus a capacitive load would substantially slow down the ECL output.

One way to improve the switching time from the high voltage to the low voltage for the ECL output driving a capacitive load, in the prior art, has been to provide a steady-state current source to pull a constant current through the emitter follower, or a resistor allowing current to flow during steady state through the emitter follower, in order to provide a pull-down current for the capacitive load. However, it is found that as the capacitance of the load increases, the amount of steady-state pull-down current required to obtain acceptable switching speeds has been large. With the high steady-state pull-down current increasing in size to increase the speed of the circuit, the power consumed by the circuit would increase unfavorably.

With the advent of integrated circuit technology and the ever-increasing number of devices on a given chip, the load capacitance of ECL gates on the chip has likewise increased. This load capacitance is due in part to the ever-lengthening amount of leads formed on the chip in order to connect a number of devices to a given output, and to the fact that a given output is required to drive a large number of devices, each having an inherent capacitance. This increased number of devices being driven by an ECL circuit can be termed as an increasing fan-out of the output voltage of the particular ECL circuit. Thus, as the fan-out of an ECL circuit increases, so does the load capacitance.

A good discussion of the fundamentals of ECL circuitry can been found in the book, *Analysis and Design of Digital Integrated Circuits,* by David A. Hodges and Horace G. Jackson (McGraw-Hill Book Co., 1983), pages 271–283.

With the increase in load capacitance being driven by ECL circuits, the output driver circuit of the prior art consisting of an emitter follower transistor with a DC pull-down current has proven to be a limiting factor in the speed and steady state power dissipation of logic circuits using ECL. Thus there is a need for an output voltage driver circuit which provides for a faster switching time with a given steady state power dissipation for ECL circuits driving a capacitive load.

SUMMARY OF THE INVENTION

In accordance with the foregoing, the present invention provides an output voltage driver apparatus for a logic circuit driving a load. The output voltage driver apparatus comprises an emitter follower means with an output emitter node and a reference emitter node. An output voltage for driving the load is supplied at the output emitter node determined by the state of the logic circuit and provides a charge-up current to the load when the output voltage swings from one level to another level. Further, a pull-down transistor means is connected to the emitter follower means at the output emitter node for providing transient pull-down current to the load when the output voltage swings from the other level to the one level. A biasing means for biasing the pull-down transistor means is connected between the reference emitter node on the emitter follower means and a bias node on the pull-down transistor means. The emitter follower means provides a reference output voltage to the biasing means through the reference emitter node which is independent of the load and thus leads the switching of the output emitter node to drive the pull-down transistor means through the bias means when the load includes a capacitive component or other component which tends to resist changes in the output voltage at the output emitter node.

DETAILED DESCRIPTION OF THE PREFERRED EMBODIMENTS

A detailed description of the preferred embodiments of the present invention is given with reference to the figures.

Figure 1:
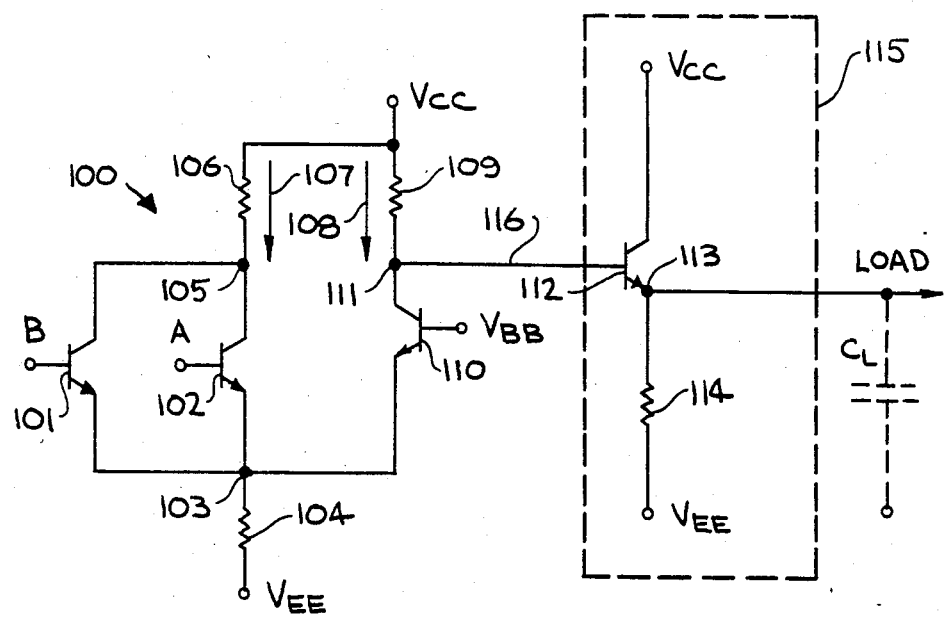
FIG. 1 is a schematic diagram showing a conventional ECL circuit with a prior art output voltage driver.

A conventional ECL circuit 100 connected as a two-input OR-gate is shown in FIG. 1. The circuit includes a first input transistor 101 and a second input transistor 102. As is known in the art, if only one input transistor is used in an ECL circuit, then the function of the circuit can be an inverter or signal propagation circuit. Furthermore, more than two input transistors may be included to form a multiple input logic device.

The input transistors 101, 102 [all] have their emitters connected to an ECL common node 103. From the ECL common node 103 to a source potential $V_{EE}$, an emitter resistor 104 is connected for biasing and current limiting purposes.

The collectors of the input transistors 101, 102 are connected to a common collector node 105 in FIG. 1. Between the common collector node 105 and a source potential $V_{CC}$, a first collector resistor 106 is connected. The path across the collector resistor 106 from $V_{CC}$ to the common collector node 105 will be termed a first path 107 as indicated by the arrow in the figure.

As an example, $V_{CC}$ is typically 5.2 volts higher than the source potential $V_{EE}$. Often $V_{CC}$ is derived from ground while $V_{EE}$ is derived from a voltage supply at −5.2 volts. The transistors used in the ECL circuit are most often of the NPN type, so the source potentials are given for the NPN type circuit. Of course, if PNP transistors were used in the circuit for the emitter-coupled logic, then the reference potentials would be reversed.

The switching characteristic of the ECL circuit 100 is provided because of a second path 108 indicated by the arrow in [the figure] FIG. 1 between $V_{CC}$ and the ECL common node 103. The second path 108 comprises a reference transistor 110 with its collector connected to one end of a second collector resistor 109, its emitter connected to the ECL common node 103 and its base connected to a voltage $V_{BB}$. The other end of the second collector resistor 109 is connected to reference $V_{CC}$. A second collector node 111 is located between the collector of transistor 110 and second collector resistor 109.

With $V_{CC}$ derived from ground, voltage $V_{BB}$ is typically about −1.2 volts. Of course, the voltage $V_{BB}$ may vary according to the desired switching level of the ECL circuit as is known in the art. With a $V_{BB}$ of about −1.2 volts if the input voltage of all the bases of the input transistors 101, 102 are low, then the voltage at the ECL common node 103 will be about diode drop below $V_{BB}$, or about −1.9 volts. The input potential is selected so that input transistors 101, 102 will be below turn-on for the input transistors 101, 102 with an emitter voltage of about −1.9 . Thus a low voltage of about −1.6 would be typical.

With both of the input transistors 101, 102 off, then current flows along the second path 108. However, if one of the input transistors 101, 102 is turned on by raising the voltage at the base of one of the input transistors 101, 102 to a high level, such as −0.75 volts, then the reference transistor 110 will turn off, and the current will switch to the first path 107.

Thus by providing an output voltage which indicates whether the current in the ECL circuit is flowing along the first path 107 or the second path 108, a logic switching device is provided. In FIG. 1, the output voltage is provided by sampling the voltage at the second collector node 111 with an ouput voltage driver circuit 115.

The prior art output voltage driver circuit 115 is comprised of an emitter follower transistor 112. The base of the emitter follower transistor 112 is connected to the second collector node 111 across sampling line 116. The collector of the emitter follower transistor 112 is connected to $V_{CC}$, and the emitter of the emitter follower transistor 112 is connected to an output node 113 providing the output voltage. Between the output node 113 to $V_{EE}$ is provided a current limiting resistor 114. The load of the ECL circuit is connected to the output node 113.

As is known in the art, the output could be sampled from the first collector node 105 to provide the complementary logic level, a NOR output in FIG. 1.

It can be seen that with no current flowing along the second path 108, the output voltage at node 113 will be about $V_{CC}$ minus a diode drop through the emitter follower transistor 112, or about −0.75, equaling the high input level for the example described herein. With current flowing along the path 108, the second collector resistor 109 and the emitter resistor 104 are selected so that the voltage at the second collector node 111 is about −0.9 volts, so that the output voltage at the output node 113 will be the low value, or about −1.6. It can be seen that the level of the output voltage at the output node 113 can be stabilized by assuring that the current through the emitter follower transistor 112 is sufficient to maintain the diode drop of about −0.75 volts across the base-emitter junction of the emitter follower transistor 112. Thus the current limiting transistor 114 is usually provided so that at the lowest output potential, the current through the emitter of the emitter follower 112 is sufficient to maintain the diode drop of about 0.75 volts.

The prior art circuit shown in FIG. 1 switches very fast for loads with very little inherent capacitance. However as the capacitance of the load $C_L$ (shown in dotted lines in FIG. 1) increases, the switching time of the circuit will increase when the swing of the output voltage at the output node 113 is from the high level to the low level. From the low level to the high level, the emitter follower transistor 112 will provide a charge-up current to the load, thus maintaining a fast switching time. However, there is no provision for a pull-down current when going from high to low except through the current limiting resistor 114 which limits the steady-state current through the output voltage driver circuit 113. A faster switching time can be obtained by lowering the value of the current limiting resistor 114 and thereby increasing the steady-state current through the output voltage driver circuit 115 and providing a larger pull-down current for the load. However, this involves a large steady-state current and thus a large amount of power to operate the device.

For the purposes of the discussion of the present invention, it is noted that the sampling line 116 in FIG. 1 from the base of the emitter follower transistor 112 to the second collector node 111 could as easily be connected to the first collector node 105 to provide the complementary output. The operation of the output voltage driver circuit 115 is not changed in that circumstance.

Figure 2:
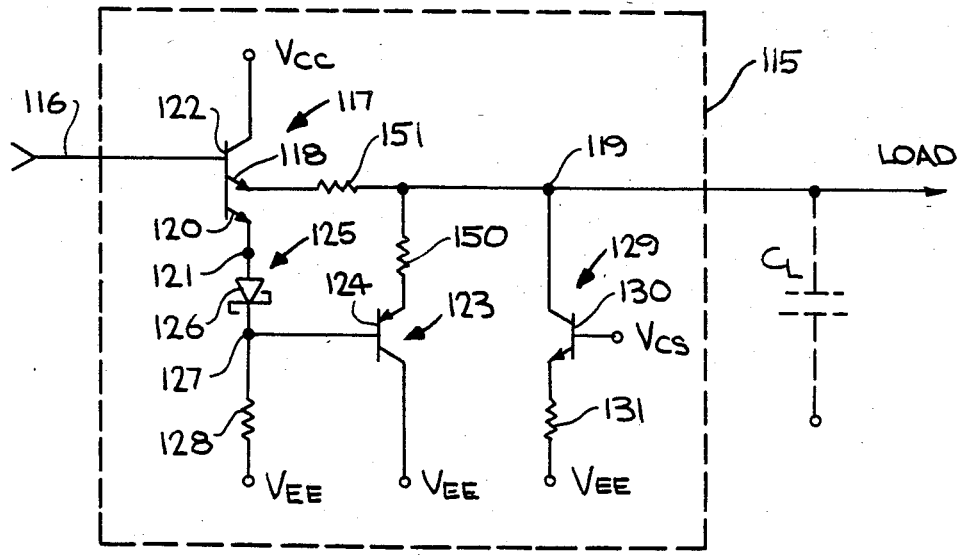
FIG. 2 is a schematic diagram of one another embodiment of the present invention.

FIG. 2 shows one embodiment of the present invention which provides a transient active pull-down current for an output voltage driver circuit 115 for a logic circuit, such as ECL. The sampling line 116 in FIG. 2 corresponds with the sampling line in FIG. 1; that is, it carries a signal indicating the state of the logic circuit.

In the output voltage driver circuit 115 shown in FIG. 2, an emitter follower means 117 is provided having an output emitter 118 for providing the output voltage for driving the load at an ouput emitter node 119. The emitter follower means 117 also includes a reference emitter 120 for providing a reference output voltage at a reference emitter node 121. The emitter follower means 117 may comprise a multiple emitter transistor 122 as shown in FIG. 2, or may comprise a first transistor and a second transistor which matches the first having the collector and base of the first transistor connected to the collector and base respectively of the second transistor (not shown). The effect is unchanged except in the manufacturing of the device.

In addition to the emitter follower means 117, a pull-down transistor means 123 is provided. The pull-down transistor means 123 is connected to the output emitter node 119 for providing transient pull-down current to the load when the output voltage swings from one level to another level, such as shown from high to low.

For the embodiment shown in FIG. 2, the pull-down transistor means 123 is a bipolar PNP transistor 124 with its emitter connected to the output emitter node 119. The collector of the PNP type bipolar transistor 124 is connected to $V_{EE}$.

As can be seen in FIG. 2, the emitter follower means 117 is constructed using NPN technology, while the pull-down transistor means 123 is constructed using PNP technology. Of course if the emitter follower means 117 were a PNP type device, then the pull-down transistor means 123 in the preferred embodiment would be an NPN type device.

A biasing means 125 for biasing the pull-down transistor means 123 is connected between the reference emitter node 121 and the pull-down transistor means 123. The base of the PNP transistor 124 is connected to the biasing means 125 at a bias node 127.

The biasing means 125 in the embodiment shown in FIG. 2 comprises a diode means 126, such as a Schottky diode, connected from the reference emitter node 121 to the bias node 127, to which the base of the PNP transistor 124 is connected. From the bias node 127 to $V_{EE}$, a current limiting resistor 128 is connected. The current limiting resistor 128 of course can be replaced by other current limiting means, such as a constant current source.

In order to stabilize the ouput voltage at the output emitter 119 by maintaining the voltage drop across the output emitter 118 at about $-0.75$ volts as discussed in reference to the prior art, a DC pull-down constant current source 129 is shown in FIG. 2 connected from the output emitter node 119 to $V_{EE}$. The DC pull-down constant current source 129 shown in FIG. 2 comprises a transistor 130 with its collector connected to the output emitter node 119, its base connected to a potential $V_{CS}$ and its emitter connected across a resistor 131 to $V_{EE}$. The resistor 131 and the reference potential $V_{CS}$ are chosen so that the transistor 130 will conduct a constant current independent of the swing and output voltage at the output emitter node 119. In this manner, a small DC pull-down current is provided through the output emitter 118 to stabilize the voltage drop across the output emitter 118. Of course, the DC pull-down constant current source 129 could be replaced by a current-limiting resistor or other current-limiting means as known in the art.

In operation, when the output voltage across sample line 116 swings from a low value to a high value, the emitter follower means 117 will provide a substantial charge-up current to the load because the voltage from the base to the output emitter 118 will forward bias the emitter follower means 117 if the load capacitance $C_L$ tries to hold the voltage down.

However, when the voltage swing is from a high value to a low value, the load capacitance $C_L$ will tend to reverse bias the emitter follower means 117, preventing any pull-down current from flowing except through the constant current source 129. However, the voltage at the reference emitter node 121 will fall independent of the load capacitance $C_L$ which restrains the output emitter node 119. Thus the voltage at the bias node 127 following the reference emitter node 121 will be about one Schottky diode voltage drop lower than the voltage at the reference emitter node 121. While the load capacitance $C_L$ tends to hold the output emitter node 119 at high value, the PNP transistor 124 of the pull-down transistor means 123 will be forward biased and provide a high transient pull-down current to the load. In steady state, with the output voltage at the output emitter node 119 equal to the voltage at the reference emitter node 121, the voltage at the bias node 127 will be about one Schottky diode drop lower than the output voltage, and thus less than the turn-on voltage of the PNP transistor 124 of the pull-down transistor means 123, preventing current from flowing through the pull-down transistor means 123. Thus in steady state, the only current flowing is that provided in the DC constant current source 129. It is found that a much faster switching time is provided using the circuit of FIG. 2 than would be available using only the DC pull-down constant current source 129.

In order to assure the turn-off of the pull-down transistor means 123 during steady state, a small resistance 150 (shown in dotted lines) may be included between the output emitter node 119 and the emitter of the PNP transistor 124. Furthermore if the small resistance 150 is included in the circuit, the Schottky diode of the biasing means 125 may be replaced by a conventional diode. Further if the small resistance 150 is included in the circuit, the manufacturer may desire to include a balancing resistor (shown in dotted lines) between the output emitter 118 and the output emitter node 119 in order balance the resistance between the output emitter node 119 and the emitter of the PNP transistor 124 in order to stabilize the output and prevent any oscillation that may otherwise occur.

Figure 3:
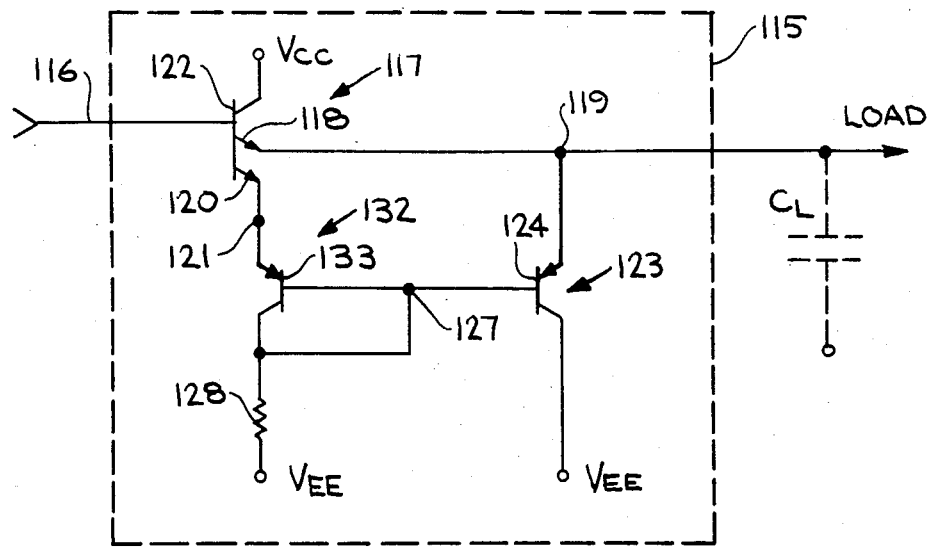
FIG. 3 is a schematic diagram of [one] another embodiment of the present invention.

A further embodiment of the output voltage driver circuit 115 of the present invention can be seen in FIG. 3. In this embodiment the bias means 125 comprises a bias transistor means 132 matching the pull-down transistor means 123. Thus the bias transistor means 132 is a PNP transistor 133 which matches the PNP transistor 124 of the pull-down transistor means 123. The PNP transistor 133 has its emitter connected to the reference emitter node 121. The base and the collector of the PNP transistor 133 of the bias transistor means 132 are both connected to the bias node 127. It can be seen that when the voltage along the sampling line 116 swings from high to low or from low to high, the embodiment shown in FIG. 3 operates in the same manner as discussed for FIG. 2. That is, for the low to high swing, the emitter follower means 117 provides a charge up current to the load. When the voltage along the sampling line 116 swings from high to low, the pull-down transistor means 123 is turned on causing a transient pull-down current to pull the charge from the capacitive load down.

However during steady state the circuit of FIG. 3 operates slightly differently than that discussed with respect to FIG. 2. Because the bias transistor means 132 is a PNP transistor 133 which matches the PNP transistor 124 of the pull-down transistor means 123, the bases of the pull-down transistor means 123 and the bias transistor means 132 are connected in common, and, during steady state, the voltage at the reference emitter node 121 is equal to the voltage at the output emitter node 119, and current mirror situation is set up. Thus the current flowing through the bias transistor means 132 from the reference emitter 120 through the current limiting resistor 128 will be mirrored during steady state by the current flowing on the path from the output emitter node 119 through the pull-down transistor means 123 to $V_{EE}$. Thus the embodiment in FIG. 3 provides a current flow through the output emitter 118 to stabilize the output voltage at the output emitter node 119 without the added DC pull-down constant current source 129 of FIG. 2. Of course the current limiting resistor 128 could be replaced by a constant current source or other current limiting means as is known in the art without altering the function of the circuit.

Figure 4:
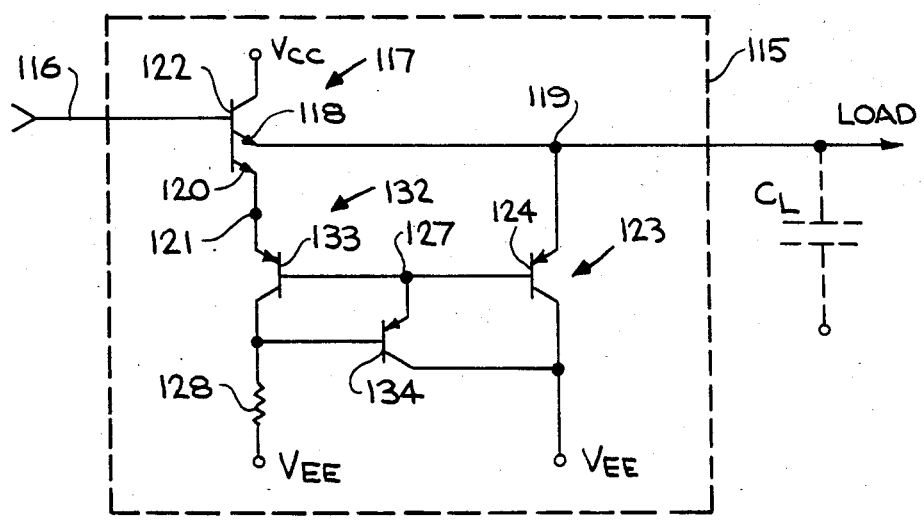
FIG. 4 is a schematic diagram of [one] yet another embodiment of the present invention.

For current technology, the switching speed for a PNP transistor as compared to an NPN transistor is relatively slow. Thus a limiting factor in the switching time from high to low for the circuits in FIG. 2 and FIG. 3 is the "beta" gain and the transit time of the pull-down transistor means 123. In FIG. 4 the "beta" gain of the pull-down transistor means 123 is increased by the addition of a second PNP transistor 134 connected with the first PNP transistor 124 of the pull-down transistor means 123 in a manner so that they act as a Darlington pair when the output voltage swings from high to low.

It can be seen from FIG. 4 that the current mirror effect is retained by connecting matching PNP transistor 133 of the biasing transistor means 132 with the first PNP transistor 124 of the pull-down transistor means 123 and constraining the voltage from the base to emitter of the two PNP transistors 133, 124 to be the same during steady state. However when the voltage at the output emitter node 119 is briefly held higher than the voltage at the reference emitter node 121 when the output swings from high to low, the PNP transistor 133 of the biasing transistor means 132 will be essentially turned off causing the voltage at the collector of the PNP transistor 133 of the biasing means 132 to drop towards the $V_{EE}$. The base of the second PNP transistor 134 of the pull-down transistor means 123 is connected at the collector of the PNP transistor 133 of the biasing transistor means 132. Thus the voltage from the base of the second PNP transistor 134 to the output emitter node 119 will be forward biased and the high current gain of the Darlington pair will be provided to cause a high transient pull-down current for the load from the output emitter node 119.

In the preferred embodiment, the output voltage driver circuit 115 as shown in FIG. 4 is manufactured on an integrated circuit in which the ECL circuitry is made with NPN type devices, and in the output voltage driver circuit 115, the biasing transistor means 132 and pull-down transistor means 123 are constructed using PNP transistors. Furthermore, the second PNP transistor 134 of the pull-down transistor means 123 can be constructed of the vertical PNP type where the collector of the second PNP transistor 134 is connected to the ground plane of the integrated circuit chip. The vertical PNP type transistor on integrated circuit chip may provide a very high gain and fast transit time as compared to a conventional laterally constructed PNP type device on an integrated circuit. Thus a high gain transistor may be used as the second PNP transistor 134 of the pull-down transistor means 123 taking advantage of the vertical PNP technology. A lateral PNP is used as the first transistor 124 of the pull-down transistor means 123 because it must match the PNP transistor 133 of the biasing transistor means 132; and because the collector of the PNP transistor 133 of the bias transistor means 132 is not connected to ground, it may not be a vertical PNP device.

The circuit as shown in FIG. 4 has been computer simulated with the first PNP transistor 124 of the pull-down transistor means 123 having a beta of 8 and the second PNP transistor 134 of the pull-down transistor means 123 having a beta of 30, to simulate the vertical and lateral arrangement discussed above. Likewise the PNP transistor 133 of the pull-down transistor means 132 is simulated with a beta of 8 to match the first transistor 124. The transit time for the PNP transistor 133 of the bias transistor means 132 and the first PNP transistor 124 of the pull-down transistor means 123 was simulated at 5 nanoseconds. The transit time for the vertical PNP of the second PNP transistor 134 of the pull-down transistor means 133 was provided as 0.75 nanoseconds. With a steady state DC pull-down current of 120 microamps, the simulation showed that for a 5 picoFarad load, about a 40% improvement in the speed of switching of the device was obtained. Further it was found that as the capacitance of the load increases, the percentage improvement in the switching time over the prior art circuit is increased.

Thus the present invention provides a output voltage driver circuit 115 for an emitter coupled logic circuit which improves the switching time of the device without increasing the DC pull-down current when the circuit must drive a capacitive load. So the present invention allows a user to drive a larger number of logic devices, using a given steady-state power and maintaining a higher switching speed than was possible before.

Other aspects and advantages of the present invention can be discerned from a study of the specification, the drawings and the claims attached hereto.

What is claimed is:

1. An output voltage driver apparatus for a circuit for driving a load, comprising:

emitter follower means, having an input connectable to the circuit, a reference emitter node and an output emitter node for providing a reference output voltage at said reference emitter node and an output voltage at said output emitter node to drive the load, said emitter follower means providing charge-up current to the load when the output voltage swings from one level to another level;

pull-down transistor means connected to said output emitter node, for providing transient pull-down current to the load when said output voltage swings from the other level to the one level and having a bias node; and a bias transistor matching said pull-down transistor means;

said bias transistor having a bias emitter, a bias base and a bias collector;

said bias emitter being connected to said reference emitter node; and said bias collector and bias base being connected in common to said bias node so that said pull-down transistor means is activated to supply said transient pull-down current when said output voltage differs from the voltage at said bias node by an amount equal to or greater than a turn on voltage and said bias transistor and said pull-down transistor means behave as a current mirror during steady state to provide an essentially constant DC current during steady state to stabilize said output voltage.

2. The apparatus of claim 1, wherein:

said pull-down transistor means comprises a first transistor and a second transistor connected as a Darlington pair; and said first transistor matches said bias transistor and is connected to behave as a current mirror during steady state with said bias transistor.

3. An output voltage driver apparatus in an ECL circuit for driving a capacitive load, the ECL circuit having one or more input transistors with emitters connected to a common node that cause current to flow along a first path if at least one of the input transistors is turned on, and a reference transistor with its emitter connected to the common node causing current to flow along a second path if none of the input transistors is turned on, said output voltage driver apparatus comprising;

emitter follower means having an output emitter node for providing an output voltage, determined by the flow of current along either the first path or the second path of the ECL circuit, for driving the capacitive load and for providing charge up current to the capacitive load when said output voltage swings from one level to another level;

said emitter follower means further having a reference emitter node for providing a reference output voltage;

pull-down transistor means connected to said output emitter node for providing transient pull-down current to the capacitive load when said output voltage swings from the other level to the one level and having a bias node; and a bias transistor matching said pull-down transistor means;

said bias transistor having a bias emitter, a bias base and a bias collector;

said bias emitter being connected to said reference emitter node; and said bias collector and bias base being connected in common to said bias node so that said bias transistor and said pull-down transistor means behave as a current mirror during steady state to provide an essentially constant DC current during steady state to stabilize said output voltage.

4. The apparatus of claim 1, wherein:
said emitter follower means is constructed using NPN bipolar transistor technology; and
said pull-down transistor means is constructed using PNP bipolar transistor technology.

5. The apparatus of claim 1, wherein:
said emitter follower means is constructed using PNP bipolar transistor technology; and
said pull-down transistor means is constructed using NPN bipolar transistor technology.

6. The apparatus of claim 1, wherein:
said emitter follower means comprises a multi-emitter transistor with a first emitter and a second emitter;
said first emitter supplying said output voltage at said output emitter node; and
said second emitter supplying said reference output voltage at said reference emitter node.

7. The apparatus of claim 1, wherein:
said emitter follower means comprises a first bipolar transistor having a first base, a first collector, and a first emitter; and
a second bipolar transistor having a second base, a second collector and a second emitter;
said first base being connected to a first node common with said second base;
said first collector being connected to a second node common with said second collector;
said first emitter supplying said output voltage at said output emitter node; and
said second emitter supplying said reference output voltage at said reference emitter node.

8. The apparatus of claim 3, wherein:
said pull-down transistor means comprises a first transistor and a second transistor connected as a Darlington pair; and
said first transistor matches said bias transistor and is connected to behave as a current mirror during steady state with said bias transistor.

9. The apparatus of claim 3, wherein:
said emitter follower means is constructed using NPN bipolar transistor technology; and
said pull-down transistor means is constructed using PNP bipolar transistor technology.

10. The apparatus of claim 3, wherein:
said emitter follower means is constructed using PNP bipolar transistor technology; and
said pull-down transistor means is constructed using NPN bipolar transistor technology.

11. The apparatus of claim 3, wherein:
said emitter follower means comprises a multi-emitter transistor with a first emitter and a second emitter;
said first emitter supplying said output voltage at said output emitter node; and
said second emitter supplying said reference output voltage at said reference emitter node.

12. The apparatus of claim 3, wherein:
said emitter follower means comprises a first bipolar transistor having a first base, a first collector, and a first emitter; and
a second bipolar transistor having a second base, a second collector and a second emitter;
said first base being connected to a first node common with said second base;
said first collector being connected to a second node common with said second collector;
said first emitter supplying said output voltage at said output emitter node; and
said second emitter supplying said reference output voltage at said reference emitter node.

* * * * *